United States Patent
Herrmann

(10) Patent No.: US 8,217,566 B2
(45) Date of Patent: Jul. 10, 2012

(54) ELECTROLUMINESCENT DEVICE AND METHOD FOR PRODUCING AN ELECTROLUMINESCENT DEVICE

(75) Inventor: Siegfried Herrmann, Neukirchen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 12/922,180

(22) PCT Filed: Jun. 17, 2009

(86) PCT No.: PCT/DE2009/000859
§ 371 (c)(1),
(2), (4) Date: Sep. 29, 2010

(87) PCT Pub. No.: WO2010/000225
PCT Pub. Date: Jan. 7, 2010

(65) Prior Publication Data
US 2011/0089812 A1    Apr. 21, 2011

(30) Foreign Application Priority Data
Jun. 30, 2008 (DE) .................. 10 2008 030 821

(51) Int. Cl.
*H05B 33/00* (2006.01)
(52) U.S. Cl. ........................ 313/498; 313/512
(58) Field of Classification Search ........... 313/498–512
See application file for complete search history.

(56) References Cited

U.S. PATENT DOCUMENTS

| | | |
|---|---|---|
| 2004/0115474 A1 | 6/2004 | Albrecht et al. |
| 2005/0236973 A1 | 10/2005 | Leo et al. |
| 2006/0273310 A1 | 12/2006 | Birnstock et al. |
| 2007/0228388 A1 | 10/2007 | Ko et al. |
| 2009/0212307 A1 | 8/2009 | Baur et al. |

FOREIGN PATENT DOCUMENTS

| | | |
|---|---|---|
| DE | 102 61 609 A1 | 7/2004 |
| DE | 10 2005 025 416 A1 | 12/2006 |
| DE | 10 2006 013 408 A1 | 9/2007 |
| EP | 1 018 718 A1 | 7/2000 |
| EP | 1 191 592 A2 | 3/2002 |
| EP | 1 418 634 A1 | 5/2004 |
| EP | 1 717 877 A2 | 4/2006 |
| EP | 1 729 346 A1 | 12/2006 |
| JP | 2003-133589 A | 5/2003 |
| JP | 2005-12092 A | 1/2005 |
| WO | 01/41223 A1 | 6/2001 |
| WO | 2006/128446 A1 | 12/2006 |

OTHER PUBLICATIONS

Chitnis, A. et al., "Submilliwatt Operation of AlInGaN Based Multifinger-Design 315 nm Light Emitting Diode (LED) over Sapphire Substrate," *Japanese Journal of Applied Physics*, Mar. 15, 2002, vol. 41, No. 3B, Part 2, pp. L320-L322.

*Primary Examiner* — Joseph L Williams
(74) *Attorney, Agent, or Firm* — DLA Piper LLP (US)

(57) ABSTRACT

An electroluminescent device includes an inorganic luminescence diode chip having a radiation exit area, a plurality of contact webs provided to spread current and arranged on the radiation exit area, and a contact structure arranged outside the radiation exit area and electrically conductively connected to contact webs.

16 Claims, 2 Drawing Sheets

ELECTROLUMINESCENT DEVICE AND METHOD FOR PRODUCING AN ELECTROLUMINESCENT DEVICE

RELATED APPLICATIONS

This is a §371 of International Application No. PCT/DE2009/000859, with an international filing date of Jun. 17, 2009 (WO 2010/000225 A1, published Jan. 7, 2010), which is based on German Patent Application No. 10 2008 030 821.8, filed Jun. 30, 2008, the subject matter of which is incorporated by reference.

TECHNICAL FIELD

This disclosure relates to an electroluminescent device and a method for producing an electroluminescent device.

BACKGROUND

In a conventional light-emitting diode chip, an electrically conductive contact structure is applied on the radiation exit area. The contact structure is usually embodied in such a way that, on the one hand, a large amount of light can emerge from the surface of the light-emitting diode chip such that the shading by the contact structure is as small as possible. On the other hand, in semiconductors having a relatively low transverse conductivity such as, for example, nitride semiconductor compounds, the current density is intended to be distributed as homogeneously as possible over the surface of the light-emitting diode chip. Consequently, inhomogeneous electric fields which, by way of example, can arise in the vicinity of a bonding pad and lead to inhomogeneous current density distributions can be avoided.

In the case of luminescence diodes having an edge length of less than approximately 300 μm, with a bonding pad arranged centrally on the radiation coupling-out area, it is possible to achieve a comparatively homogeneous current distribution in the diode chip. However, the bonding wire projecting beyond the surface brings about a shading of the radiation exit area or a reduction of the proportion of radiation coupled out. In the case of large-area luminescence diode chips having an edge length of up to 1 mm, for example, this type of contact-connection can lead to an inhomogeneous energization.

To increase the proportion of radiation coupled out, DE 102005025416 A1 describes, in the case of a luminescence diode chip, arranging the bonding pad in an edge region of the radiation exit area.

It could thus be helpful to provide an electroluminescent device and a method for producing an electroluminescent device wherein the emission of radiation is increased further.

SUMMARY

I provide an electroluminescent device including an inorganic luminescence diode chip having a radiation exit area, a plurality of contact webs provided to spread current and arranged on the radiation exit area, and a contact structure arranged outside the radiation exit area and electrically conductively connected to contact webs.

I also provide a method for producing an electroluminescent device including providing a luminescence diode chip having a radiation exit area, forming a plurality of contact webs that spread current and are arranged on the radiation exit area, and forming a contact structure arranged outside the radiation exit area and electrically conductively connected to contact webs.

DETAILED DESCRIPTION

Figure 1:
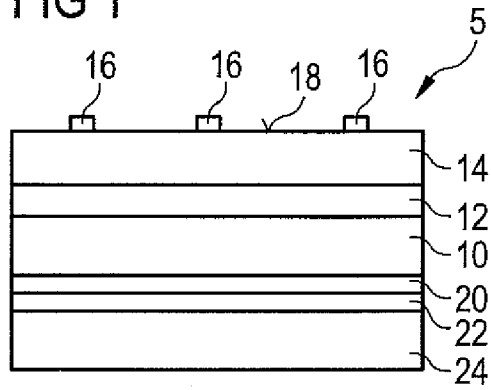
FIG. 1 shows a first example of an electroluminescent device in a schematic cross-sectional view.

I provide an electroluminescent device comprising a radiation exit area, a plurality of contact webs provided for current spreading purposes and arranged on the radiation exit area, and a contact structure, which is arranged outside the radiation exit area and electrically conductively connected to the contact webs.

The current spreading may be effected on an insulating web arranged outside the radiation exit area. Consequently, shading is avoided and the necessary area of the current distribution paths, for example, on a luminescence diode chip, can be reduced significantly, for example, by up to 30%. This permits a simple construction of an electroluminescent device wherein, by way of example, it is not necessary to implement special measures for avoiding the production of light directly below a contact.

Preferably, the insulating web arranged outside the radiation exit area has a height which differs only slightly or not at all from the plane of the radiation exit area to enable simple contact-connection without having to overcome steps.

In the case of the electroluminescent device, a further contact structure may furthermore be arranged outside the radiation exit area and in a manner lying opposite the contact structure on a further web and is electrically conductively connected to the contact webs.

The current distribution paths are thus connected on both sides by the contact structures on the webs. On account of the connection on both sides, the voltage drop is reduced further such that it is possible to further reduce the width of the contact webs on the radiation exit area.

The web may be composed of an electrically insulating material, preferably a plastic. A suitable insulating material is, in particular, benzocyclobutene (BCB), which has electrically insulating properties and can be integrated into semiconductor-technological fabrication steps without any problems. Benzocyclobutene (BCB) is used in microelectromechanical systems technology (MEMS), for example.

A first contact area may furthermore be provided, which is connected to the contact structure by a conductive area.

The first contact area can be connected, for example, to an LED housing, a carrier, or, by plated-through holes to an external voltage source such that the electroluminescent device is electrically contact-connected. Since the contact-connection is effected outside the radiation-emitting region, shading can be avoided.

The electroluminescent device may have a luminescence diode chip, preferably a thin-film luminescence diode chip.

During the production of a thin-film luminescence diode chip, a function semiconductor layer sequence comprising, in particular, a radiation-emitting active layer is firstly grown epitaxially on a growth substrate, then a new carrier is applied to that surface of the semiconductor layer sequence which lies opposite the growth substrate, and the growth substrate is subsequently separated. Since, in particular, the growth substrates used for nitride compound semiconductors, for example, SiC, sapphire or GaN are comparatively expensive, this method affords the advantage, in particular, that the growth substrate can be reused. Detachment of a growth substrate composed of sapphire from a semiconductor layer sequence composed of a nitride compound semiconductor can be effected by a lift-off method, for example.

In particular, the luminescence diode chip can have an epitaxial layer sequence based on a III-V compound semiconductor material, preferably nitride compound semiconductor, but also phosphide compound semiconductor materials or arsenide compound semiconductor materials.

"Based on nitride compound semiconductors" means that the active epitaxial layer sequence or at least one layer thereof comprises a nitride III/V compound semiconductor material, preferably $Al_xGa_yIn_{1-x-y}N$, where $0 \leq x \leq 1$, $0 \leq y \leq 1$ and $x+y \leq 1$. In this case, this material need not necessarily have a mathematically exact composition according to the above formula. Rather, it can comprise one or more dopants and additional constituents which essentially do not change the characteristic physical properties of the $Al_xGa_yIn_{1-x-y}N$ material. For the sake of simplicity, however, the above formula only includes the essential constituents of the crystal lattice (Al, Ga, In, N), even if these can be replaced in part by small amounts of further substances.

"Based on phosphide compound semiconductors" means that the active region, in particular the semiconductor body, preferably comprises $Al_nGa_mIn_{1-n-m}P$ or consists thereof, where $0 \leq n \leq 1$, $0 \leq m \leq 1$ and $n+m \leq 1$, preferably where $n \neq 0$, $n \neq 1$, $m \neq 0$ and/or $m \neq 1$. In this case, this material need not necessarily have a mathematically exact composition according to the above formula. Rather, it can comprise one or more dopants and additional constituents which essentially do not change the physical properties of the material. For the sake of simplicity, however, the above formula only includes the essential constituents of the crystal lattice (Al, Ga, In, P), even if these can be replaced in part by small amounts of further substances.

"Based on arsenide compound semiconductors" means that the active region, in particular the semiconductor body, preferably comprises $Al_nGa_mIn_{1-n-m}As$ or consists thereof, where $0 \leq n \leq 1$, $0 \leq m \leq 1$ and $n+m \leq 1$, preferably where $n \neq 0$, $n \neq 1$, $m \neq 0$ and/or $m \neq 1$. In this case, this material need not necessarily have a mathematically exact composition according to the above formula. Rather, it can comprise one or more dopants and additional constituents which essentially do not change the physical properties of the material. For the sake of simplicity, however, the above formula only includes the essential constituents of the crystal lattice (Al, Ga, In, As), even if these can be replaced in part by small amounts of further substances.

In the case of the electroluminescent device, indium tin oxide may be provided as material for the contact webs.

In this instance, which is suitable in particular, for relatively small chips, that is to say for chips having a side length of 200 µm or less, an optically transparent, electrically conductive material is used for the current spreading on the radiation exit area. Consequently, metallic contacts are completely eliminated. Accordingly, the radiation efficiency is increased further.

This may be achieved by a method for producing an electroluminescent device, wherein the following steps are performed:

providing a luminescence diode chip having a radiation exit area, forming a plurality of contact webs which are provided for current spreading purposes and are arranged on the radiation exit area, and forming a contact structure, which is arranged outside the radiation exit area, preferably on a web, and is electrically conductively connected to the contact webs.

Accordingly, the current spreading is effected on an insulating web arranged outside the radiation exit area. Consequently, shading is avoided and the necessary area of the current distribution paths, for example, on a luminescence diode chip, can be reduced significantly, for example, by up to 30%. This permits a simple construction of an electroluminescent device wherein, by way of example, it is not necessary to implement special measures for avoiding the production of light directly below a contact.

My devices and methods are explained in greater detail below on the basis of a plurality of examples with reference to the figures. Elements, regions and structures which are functionally identical or identical in terms of their effect bear identical reference symbols. Insofar as elements, regions or structures correspond in terms of their function, the description thereof is not necessarily repeated in each of the figures.

A first example of an electroluminescent device, for example comprising a luminescence diode chip, is illustrated schematically in a cross-sectional view in FIG. 1. The luminescence diode chip 5 is constructed from a semiconductor layer sequence 10, 12 and 14, which is produced epitaxially, for example.

The semiconductor layer sequence contains an active layer 12 preferably designed for generating radiation. Preferably, the respective semiconductor body is embodied as a luminescence diode semiconductor body to emit electromagnetic radiation, for example, radiation in the ultraviolet, blue or green spectral range. The active layer 12 is arranged between an n-conducting semiconductor layer 14 and a p-conducting semiconductor layer 10.

The radiation emitted from the active layer 12 is coupled out from the luminescence diode chip on the radiation exit area 18.

For the purpose of impressing current into the active layer 12, a contact structure 16 is provided on the surface. The contact structure 16 preferably contains a metal or a metal alloy. In particular, the contact structure 16 can be formed from a patterned indium tin oxide layer or a titanium-platinum-gold layer sequence (not illustrated). Known patterning methods, for example, lithographic patterning by a mask and subsequent etching processes, can be used for patterning purposes. The contact structure 16 is preferably free of aluminum or silver to be insensitive toward electromigration.

The luminescence diode chip 5 is a thin-film luminescence diode chip, for example. A contact layer 20 can be arranged below the p-conducting semiconductor layer 10, that is to say on the side lying opposite the radiation exit area 18, the contact layer forming a second electrical contact of the luminescence diode chip that lies opposite the contact structure 16 as viewed from the active layer 12.

The active layer 12 of the luminescence diode chip comprises, for example, $In_xAl_yGa_{1-x-y}N$ where $0 \leq x \leq 1$, $0 \leq y \leq 1$ and $x+y \leq 1$. The active layer 12 can be embodied, for example, as a heterostructure, double heterostructure or as a quantum well structure. In this case, the designation quantum well structure encompasses any structure in which charge carriers experience a quantization of their energy states as a result of confinement. In particular, the designation quantum well structure does not include any indication about the dimensionality of the quantization. It therefore encompasses, inter alia, quantum wells, quantum wires and quantum dots and any combination of these structures.

The contact layer 20 can be fixed on a carrier 24 by a connecting layer 22, for example, a solder layer. The carrier 24 is, for example, a circuit board, in particular a printed circuit board. Furthermore, the carrier 24 can be formed from ceramic, for example, aluminum nitride. Other known materials such as, for example, a semiconductor material, can likewise be used.

Figure 2:
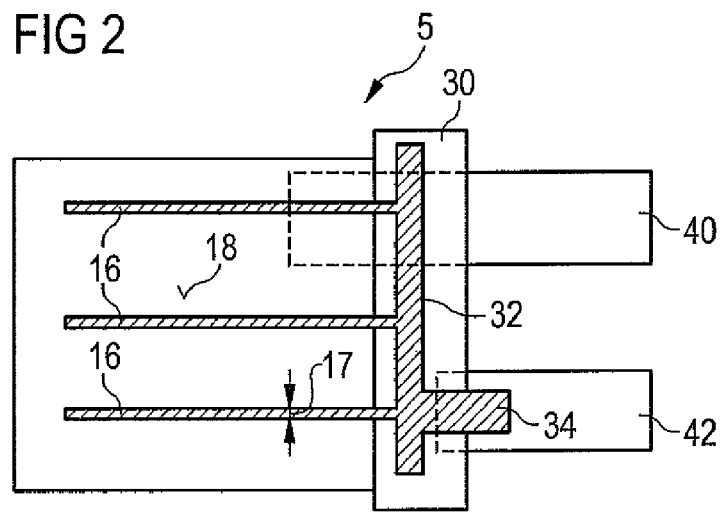
FIG. 2 shows a second example of an electroluminescent device in a schematic plan view.

FIG. 2 shows a second example of an electroluminescent device comprising a luminescence diode chip 5 in accordance with FIG. 1. As can be discerned in the plan view in FIG. 2, a plurality of contact webs 16 are arranged on the radiation exit area 18. The luminescence diode chip 5 is embodied in rectangular fashion, wherein the side lengths of the rectangle can vary over a large range. Thus, it is possible, on the one hand, to form luminescence diode chips having a side length of 100 µm. However, it is also possible to use large-area luminescence diode chips having a side length of 1 mm or more.

A web 30 composed of an electrically insulating material is arranged outside the radiation exit area 18, that is to say alongside the luminescence diode chip 5. The web 30 can be fitted, for example, together with the luminescence diode chip 5 on the carrier 24. Preferably, the web 30 has a height that differs only slightly or not at all from the luminescence diode chip 5.

FIG. 2 shows three contact webs 16, for example, which have a width 17 of typically 20 µm. The contact webs 16 are connected to a contact structure 32 arranged on the surface of the web 30. For this purpose it is possible to use an electrically conductive material, for example, preferably a metal layer which is vapor-deposited onto the web 30 and suitably patterned.

Two contact areas 40 and 42 are situated on that side of the web 30 which is remote from the luminescence diode 5. The first contact area 42 serves for forming a connection to the contact structure 32 and hence the contact webs 16. For this purpose a conductive area 34 is provided, which connects the contact structure 32 to the first contact area 42. The conductive area can likewise be a suitably patterned metal layer.

It is likewise possible to produce the contact structure 32 and the conductive area 34 as a single layer. The second contact area 40 serves for producing a connection to the contact layer 20.

As is depicted in FIG. 2, for this purpose the second contact area can extend below the web 30 as far as the luminescence diode chip 5. The first contact area 42 ends below or in front of the web 30, for example, such that no short circuit with the contact layer 20 on the rear side of the luminescence diode chip 5 takes place. The web is produced from an electrically insulating material, plastic preferably being used. In the technology of microelectromechanical systems (MEMS), the polymer benzocyclobutene (BCB) has been found to be readily processable.

To insure that the radiation exit area 18 is only slightly shaded by the contact webs 16, it is possible, for example, to apply a transparent layer for the contact webs 16. By way of example, indium tin oxide can be used for this purpose.

Figure 3:
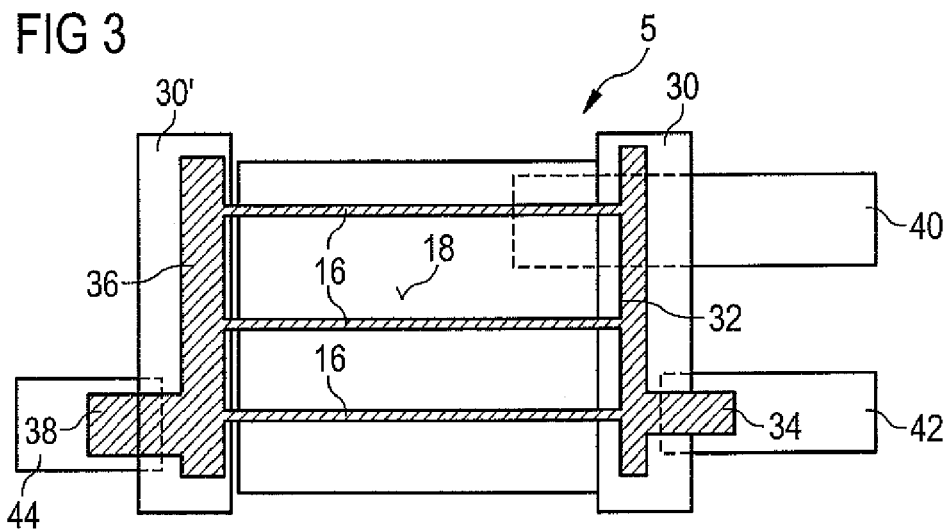
FIG. 3 shows a further example of an electroluminescent device in a schematic plan view.

A third example of an electroluminescent device is shown below with reference to FIG. 3. This example differs from that in accordance with FIG. 2 in that the contact webs are now formed over the entire radiation exit area as parallel lines. A further contact structure 36 is arranged on the side lying opposite the first contact structure 32, the further contact structure being electrically conductively connected to the contact webs 16.

The further contact structure 36 can likewise be arranged on a further web 30', which, like the web 30, consists of insulating plastic material. The further contact structure 36 is connected to a third contact area 44 by a further electrically conductive area 38.

Since the voltage impressed for current spreading purposes can now be supplied on the radiation exit area 18 from both sides, that is to say via the first contact area 42 and the third contact area 44, only a small voltage drop occurs across the radiation exit area 18. The embodiment in accordance with FIG. 3 is suitable both for very thin contact webs 16 and for large-area radiation exit areas 18.

Figure 4:
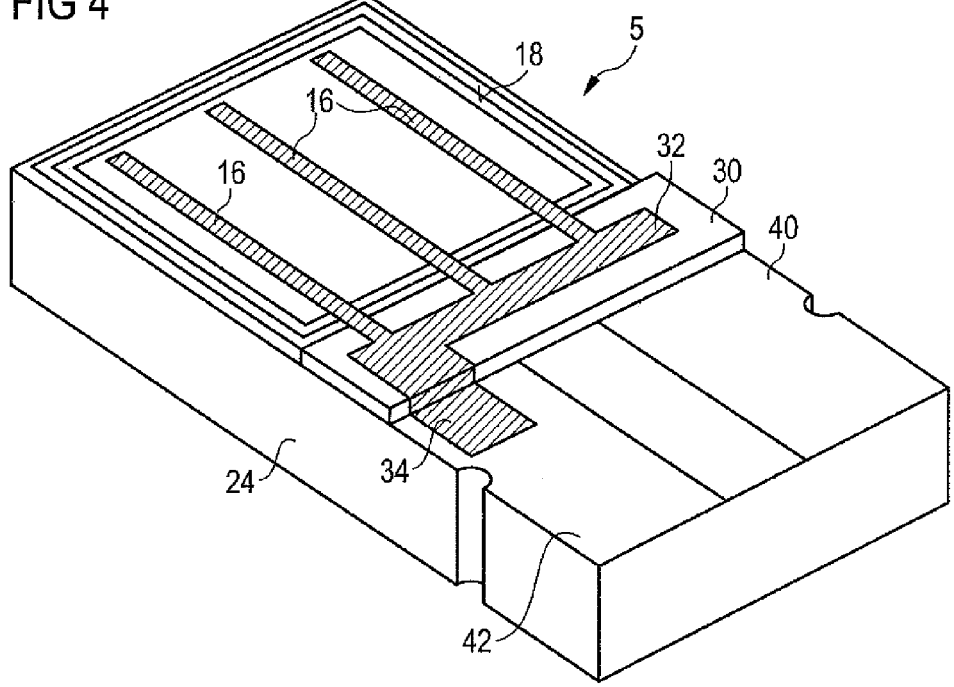
FIG. 4 shows a further example of an electroluminescent device in a schematic perspective side view.

A further example of an electroluminescent device is shown in a schematic side view with reference to FIG. 4. To produce an electroluminescent device, in a first step, by way of example, the luminescence diode chip 5 can be provided. The chip is applied on the carrier 24, as is shown in FIG. 4. This is followed by applying the web 30 and forming the contact webs 16, the contact structure 32 and the first conductive area 34, wherein, by way of example, a metal layer is vapor-deposited and patterned. The finished electroluminescent device produced can, in the subsequent steps, be supplied with external voltage sources at the first contact area 42 and the second contact area 40, and/or be integrated into a housing.

Furthermore, it is likewise possible to perform even further process steps such as, for example, applying a converter layer to the radiation exit area 18. The converter layer is a silicone layer, for example, into which at least one luminescence conversion substance is embedded. The at least one luminescence conversion substance can be, for example, YAG:Ce or a known luminescence conversion substance.

By a luminescence conversion substance, for example, the wavelength of at least part of the radiation emitted from the active layer 12, which radiation is green, blue or ultraviolet light, for example, is converted into a complementary spectral range in such a way that white light arises.

The use of a silicone layer as carrier layer for the luminescence conversion substance has the advantage that silicone is comparatively insensitive to short-wave blue or ultraviolet radiation. This is advantageous, in particular, for luminescence diode chips which are based on nitride compound semiconductors and in which the emitted radiation generally contains at least one component from the short-wave blue or ultraviolet spectral range. Alternatively, some other transparent organic or inorganic material can also function as a carrier layer for the at least one luminescence conversion substance.

Further process steps comprise applying the contact layer 20 as a reflective contact layer. Furthermore, a barrier layer can be arranged between the contact layer 20 and the connecting layer 22. The barrier layer contains TiWN, for example. The barrier layer prevents, in particular, diffusion of material of the connecting layer 22, which is a solder layer, for example, into the reflective contact layer 20, which might impair, in particular, the reflection of the reflective contact layer 20. However, these steps are known and will therefore not be described in greater detail.

Figure 5:
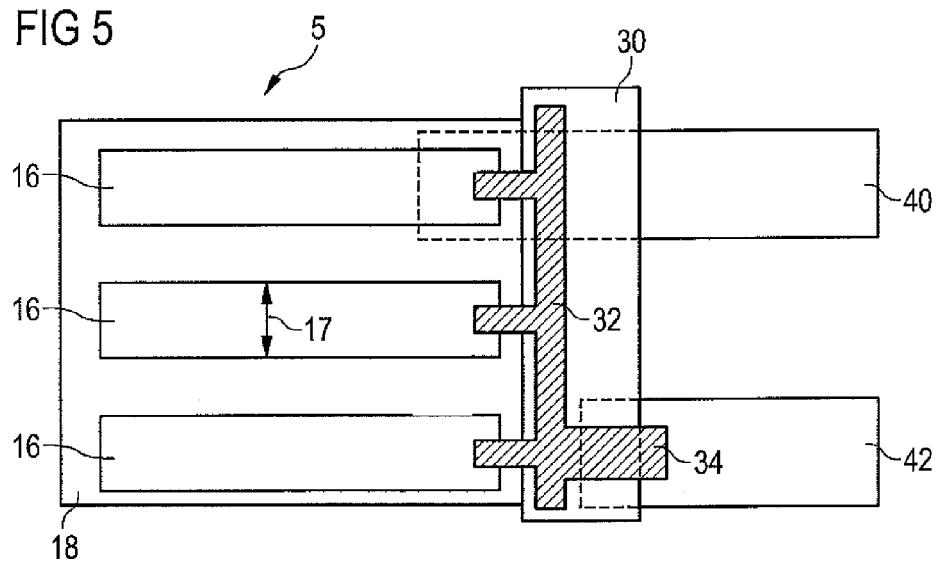
FIG. 5 shows a further example of an electroluminescent device in a schematic plan view.

FIG. 5 shows a further example of an electroluminescent device in a plan view comprising a luminescence diode chip 5 in accordance with FIG. 1. As can be discerned in FIG. 5, a plurality of contact webs 16 are arranged on the radiation exit area 18. The luminescence diode chip 5 is formed in rectangular fashion, wherein the side lengths of the rectangle can once again vary over a large range. Thus, it is possible, on the one hand, to form luminescence diode chips having a side length of 100 μm. However, it is also possible to use large-area luminescence diode chips having a side length of 1 mm or more.

A web 30 composed of the electrically insulating material is arranged outside the radiation exit area 18, that is to say alongside the luminescence diode chip 5, the web being fitted for example together with the luminescence diode chip 5 on the carrier 24.

FIG. 5 shows three contact webs 16, for example, which have a width 17 of typically 100 μm. The contact webs 16 are connected to a contact structure 32 arranged on the surface of the web 30. For this purpose it is possible to use an electrically conductive material, for example, preferably a metal layer, which is vapor-deposited onto the web 30 and suitably patterned.

As in the example in accordance with FIG. 2, two contact areas 40 and 42 are situated on that side of the web 30 which is remote from the luminescence diode 5. The first contact area 42 serves for forming a connection to the contact structure 32 and hence the contact webs 16. For this purpose, the conductive area 34 is provided, which connects the contact structure 32 to the first contact area 42. The conductive area can likewise be a suitably patterned metal layer.

It is likewise possible to produce the contact structure 32 and the conductive area 34 as a single layer. The second contact area 40 serves for producing a connection to the contact layer 20.

As is depicted in FIG. 5, for this purpose the second contact area can extend below the web 30 as far as the luminescence diode chip 5. The first contact area 42 ends below or in front of the web 30, for example, such that no short circuit with the contact layer 20 on the rear side of the luminescence diode chip 5 takes place.

The web is once again produced from an electrically insulating material, plastic preferably being used. In the technology of microelectromechanical systems (MEMS) the polymer benzocyclobutene (BCB) has been found to be readily processable.

So that the radiation exit area 18 is only slightly shaded by the contact webs 16, it is possible, for example, to apply a transparent layer for the contact webs 16. By way of example, indium tin oxide can be used for this purpose. Accordingly, it is possible to apply the contact webs in large-area fashion on the radiation exit area 18, as is shown in FIG. 5. The connection to the contact structure 32 can in this case be effected at the edge of the radiation exit area 18, such that the electrical connection between the contact structure 32 and the contact webs 16 leads to no or only to slight shading. It is likewise possible, of course, to fit a different number of contact webs 16 on the radiation exit area 18, in which case the whole-area formation of a transparent layer for the contact webs 16 also lies within the scope of this disclosure.

This disclosure is not restricted by the description on the basis of the examples. Rather, the disclosure encompasses any novel feature and also any combination of features, which in particular includes any combination of features in the appended claims, even if this feature or this combination itself is not explicitly specified in the claims or examples.

What is claimed is:

1. An electroluminescent device comprising:
    an inorganic luminescence diode chip having a radiation exit area,
    a plurality of contact webs provided to spread current and arranged on the radiation exit area, and
    a contact structure arranged outside the radiation exit area on a web and electrically conductively connected to contact webs, wherein the web is arranged alongside the luminescence diode chip.

2. The electroluminescent device as claimed in claim 1, further comprising a first contact area connected to the contact structure by a conductive area.

3. The electroluminescent device as claimed in claim 1, wherein the further contact structure is arranged outside the radiation exit area and in a manner lying opposite the contact structure and is electrically conductively connected to the contact webs.

4. The electroluminescent device as claimed in claim 3, further comprising a second contact area connected to the further contact structure by a further conductive area.

5. The electroluminescent device as claimed in claim 1, wherein the contact webs have a width between 10 μm and 30 μm inclusive.

6. The electroluminescent device as claimed in claim 1, wherein the contact webs cover less than 20% of the radiation exit area.

7. The electroluminescent device as claimed in claim 1, wherein the contact webs are a patterned indium tin oxide layer.

8. The electroluminescent device as claimed in claim 1, wherein the luminescence diode chip has a contact layer on a side lying opposite the radiation exit area, said contact layer being connected to a third contact area.

9. The electroluminescent device as claimed in claim 1, further comprising first, second and/or third contact areas applied on a carrier.

10. The electroluminescent device as claimed in claim 9, wherein a connecting layer is applied between the contact layer and the carrier.

11. The electroluminescent device as claimed in claim 1, wherein at least one side edge of the radiation exit area has a length of 100 μm or more.

12. The electroluminescent device as claimed in claim 9, wherein the carrier is a printed circuit or a ceramic lamina.

13. The electroluminescent device as claimed in claim 10, wherein the connecting layer is a solder layer.

14. A method for producing an electroluminescent device comprising:
    providing a luminescence diode chip having a radiation exit area,
    forming a plurality of contact webs that spread current and are arranged on the radiation exit area, and
    forming a contact structure arranged outside the radiation exit area on a web and electrically conductively connected to contact webs, wherein the web is arranged alongside the luminescence diode chip.

15. An electroluminescent device comprising:
    an inorganic luminescence diode chip having a radiation exit area,
    a plurality of contact webs provided to spread current and arranged on the radiation exit area, and
    a contact structure arranged outside the radiation exit area on a web and electrically conductively connected to contact webs, wherein the web consists of an electrical insulating material.

16. The electroluminescent device as claimed in claim 15, wherein the electrical insulating material is benzocyclobutene.

* * * * *